US009099648B2

United States Patent
Yamato et al.

(10) Patent No.: US 9,099,648 B2
(45) Date of Patent: Aug. 4, 2015

(54) METHOD FOR MANUFACTURING SEMICONDUCTOR MEMORY DEVICE AND SEMICONDUCTOR MEMORY DEVICE

(71) Applicant: Kabushiki Kaisha Toshiba, Minato-ku (JP)

(72) Inventors: Masaki Yamato, Mie-ken (JP); Takeshi Yamaguchi, Mie-ken (JP); Shigeki Kobayashi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/023,865

(22) Filed: Sep. 11, 2013

(65) Prior Publication Data
US 2014/0326939 A1    Nov. 6, 2014

Related U.S. Application Data

(60) Provisional application No. 61/818,643, filed on May 2, 2013.

(51) Int. Cl.
  *H01L 27/24* (2006.01)
  *H01L 45/00* (2006.01)

(52) U.S. Cl.
  CPC .......... *H01L 45/1616* (2013.01); *H01L 27/249* (2013.01); *H01L 45/04* (2013.01); *H01L 45/1226* (2013.01); *H01L 45/146* (2013.01)

(58) Field of Classification Search
  None
  See application file for complete search history.

(56) References Cited

U.S. PATENT DOCUMENTS

| | | | |
|---|---|---|---|
| 7,700,935 B2 * | 4/2010 | Kim et al. | 257/5 |
| 7,910,914 B2 * | 3/2011 | Tanaka et al. | 257/5 |
| 7,983,065 B2 | 7/2011 | Samachisa | |
| 8,199,576 B2 | 6/2012 | Fasoli et al. | |
| 8,295,077 B2 | 10/2012 | Murooka | |
| 8,299,571 B2 * | 10/2012 | Ozawa et al. | 257/530 |
| 8,338,224 B2 * | 12/2012 | Yoon et al. | 438/102 |
| 8,426,306 B1 * | 4/2013 | Gee et al. | 438/622 |
| 2008/0123390 A1 * | 5/2008 | Kim et al. | 365/148 |
| 2008/0265235 A1 * | 10/2008 | Kamigaichi et al. | 257/2 |
| 2010/0259962 A1 | 10/2010 | Yan et al. | |
| 2011/0205783 A1 | 8/2011 | Murooka | |
| 2012/0061637 A1 | 3/2012 | Cai et al. | |
| 2012/0147649 A1 * | 6/2012 | Samachisa et al. | 365/51 |
| 2012/0261638 A1 | 10/2012 | Sills et al. | |
| 2013/0134377 A1 * | 5/2013 | Park et al. | 257/4 |
| 2013/0153848 A1 * | 6/2013 | Park et al. | 257/2 |
| 2013/0187118 A1 | 7/2013 | Murooka | |
| 2013/0193395 A1 * | 8/2013 | Lee | 257/4 |
| 2013/0229846 A1 * | 9/2013 | Chien et al. | 365/51 |

FOREIGN PATENT DOCUMENTS

JP    2010-9669    1/2010

* cited by examiner

*Primary Examiner* — Andres Munoz
(74) *Attorney, Agent, or Firm* — Oblon, McClelland, Maier & Neustadt, L.L.P.

(57) ABSTRACT

According to one embodiment, a manufacturing method of a semiconductor memory device includes forming a stacked body in which word line material layers and insulating layers are alternately stacked on a base layer. The method includes forming first holes on the stacked body so as to be arranged in a first direction and in a second direction that intersects with the first direction. The method includes forming resistance-change films on inner walls of the first holes, forming bit lines inside the resistance-change films in the first holes, and dividing the stacked body in the first direction by forming second holes so that a portion in the stacked body adjacent to the resistance-change films in the second direction. The method includes forming inter-bit line insulating films in the second holes.

6 Claims, 11 Drawing Sheets

METHOD FOR MANUFACTURING SEMICONDUCTOR MEMORY DEVICE AND SEMICONDUCTOR MEMORY DEVICE

CROSS-REFERENCE TO RELATED APPLICATIONS

This application is based upon and claims the benefit of priority from U.S. Provisional Patent Application 61/818,643, filed on May 2, 2013; the entire contents of which are incorporated herein by reference.

FIELD

Embodiments described herein relate generally to a method for manufacturing a semiconductor memory device and the semiconductor memory device.

BACKGROUND

A resistance random access memory that has a structure that laminates word line array layers including line-shaped word lines, provides bit lines in pillar shapes in a stacking direction, and provides resistance-change films between the word lines and the bit lines is being proposed.

BRIEF DESCRIPTION OF THE DRAWINGS

FIG. 4A to FIG. 11B are schematic plan views showing method for manufacturing the semiconductor memory devices of the embodiments.

DETAILED DESCRIPTION

According to one embodiment, a manufacturing method of a semiconductor memory device is disclosed. The method can include forming a stacked body in which word line material layers and insulating layers are alternately stacked on a base layer. The method can include forming first holes on the stacked body so as to be arranged in a first direction and in a second direction that intersects with the first direction. The method can include forming resistance-change films on inner walls of the first holes. The method can include forming bit lines inside the resistance-change films in the first holes. The method can include dividing the stacked body in the first direction by forming second holes so that a portion in the stacked body adjacent to the resistance-change films in the second direction. In addition, the method can include forming inter-bit line insulating films in the second holes.

Hereinbelow, embodiments will be described with reference to the drawings. Note that, in the drawings, same reference signs are given to same elements.

Figure 1:
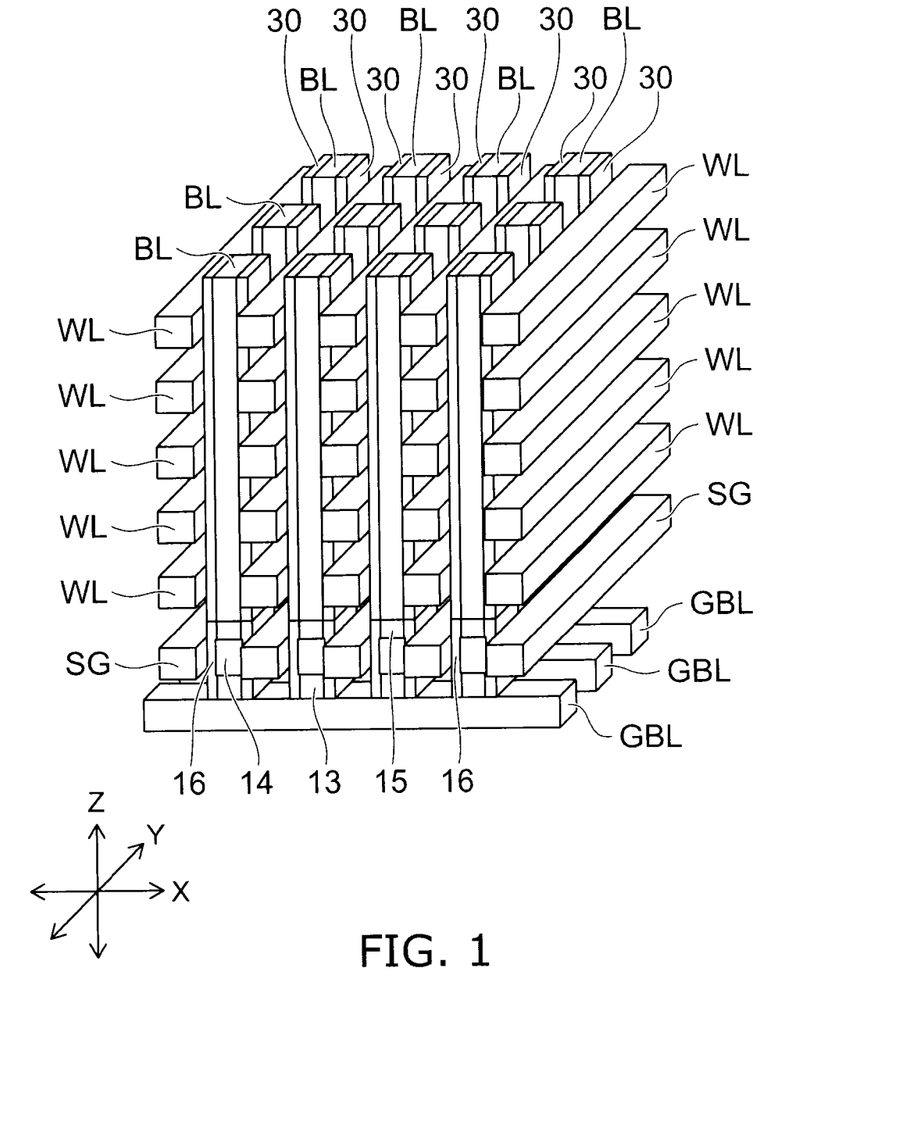
FIG. 1 is a schematic perspective view showing an example of a memory cell array of a semiconductor memory device of an embodiment.

FIG. 1 is a schematic perspective view illustrating an example of a memory cell array of a semiconductor memory device of an embodiment. In FIG. 1, illustration of insulating films between respective wires is omitted.

Figure 2:
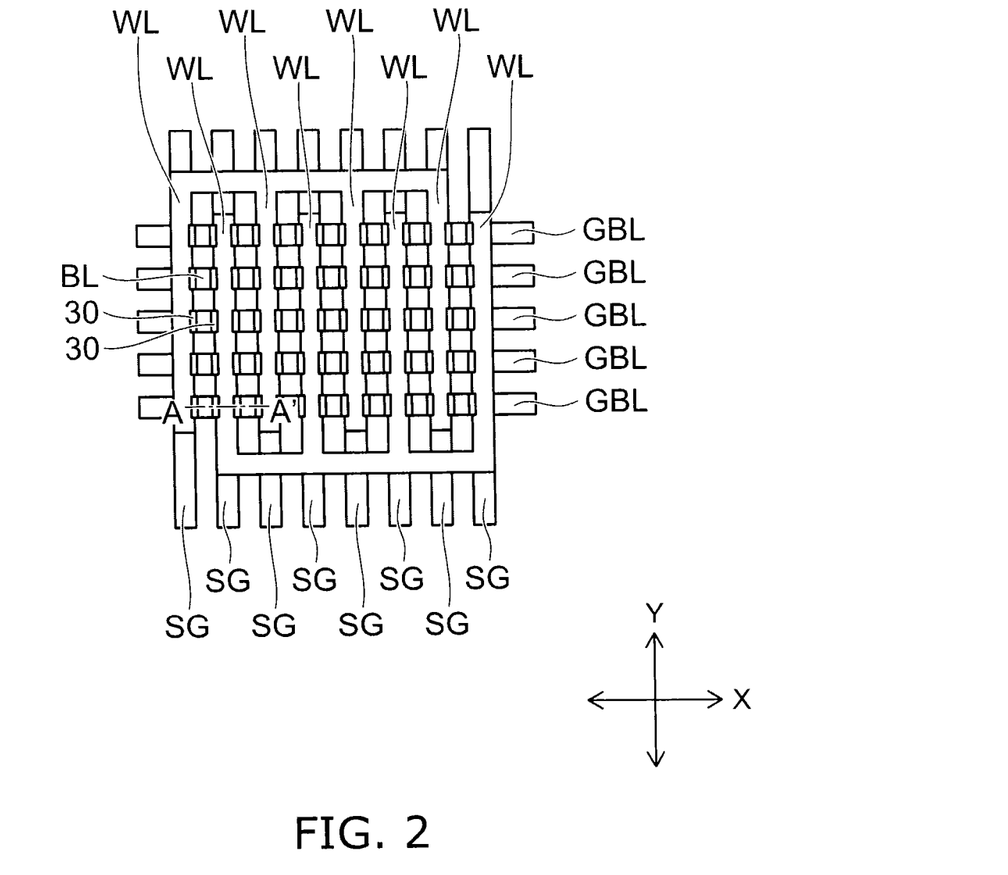
FIG. 2 is a schematic plan view showing an example of the memory cell array of the semiconductor memory device of the embodiment.

FIG. 2 is a schematic plan view illustrating the example of the memory cell array illustrated in FIG. 1. FIG. 2 corresponds to a cross section that is parallel to an XZ plane in FIG. 1.

Figure 3:
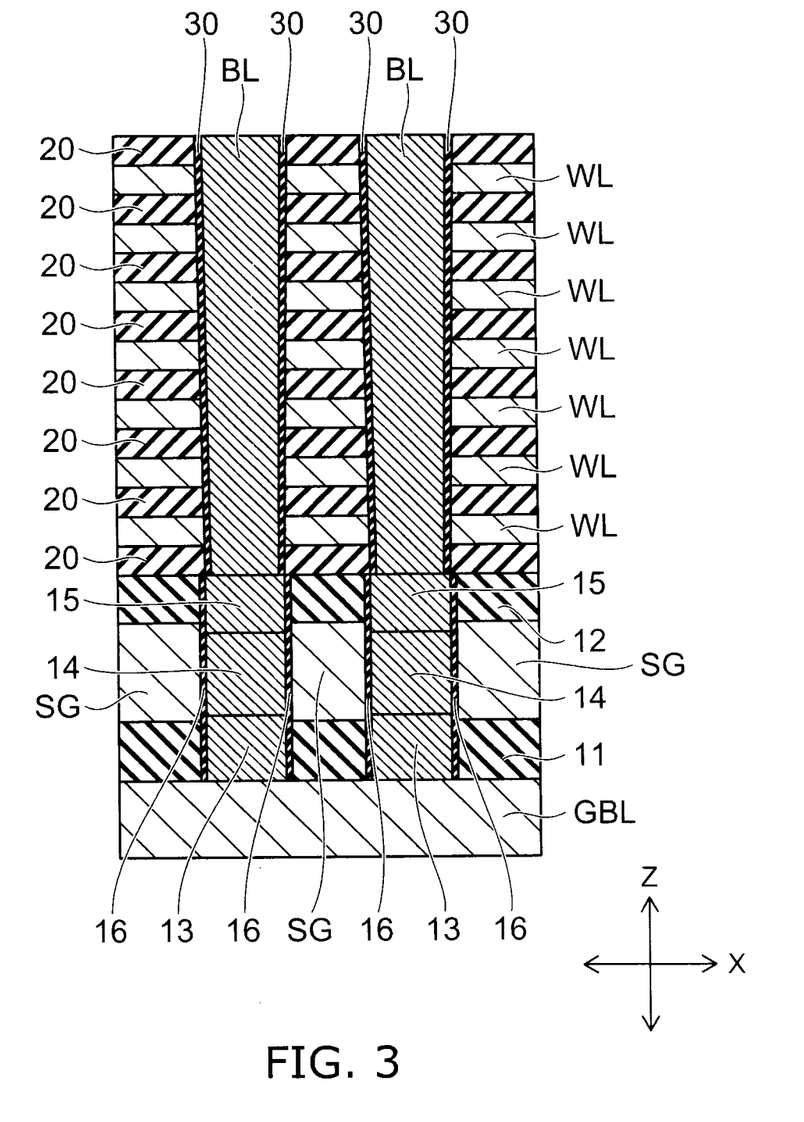
FIG. 3 is an A-A' cross sectional view of FIG. 2.

FIG. 3 is an A-A' cross sectional view of FIG. 2.

Global bit lines GBL are provided on a substrate via insulating layers (all of which are not illustrated). The global bit lines GBL extend in an X direction (first direction). The plurality of global bit lines GBL is aligned in a Y direction (second direction) via inter-wire insulating films that are not illustrated. The global bit lines GBL are formed for example of a metal material.

The X direction and the Y direction intersect orthogonally in a plane that is parallel to a main surface of the substrate. Further, a direction that is vertical to the main surface of the substrate and intersects orthogonally to the X direction and the Y direction will be termed a Z direction (third direction).

As illustrated in FIG. 3, interlayer insulating films 11 are provided on the global bit lines GBL. The interlayer insulating films 11 are for example silicon oxide films.

Select gate lines SG are provided on the interlayer insulating films 11. The select gate lines SG are for example titanium nitride films. Alternatively, the select gate lines SG may be silicon films to which impurities are added and that have conductivity.

As illustrated in FIG. 1, the select gate lines SG extend in the Y direction. The select gate lines SG are aligned in the X direction.

Channel bodies 14 are provided via conductive layers 13 on the global bit lines GBL. Conductive layers 15 are provided on the channel bodies 14.

The conductive layers 13, the channel bodies 14, and the conductive layers 15 are formed of, for example, polysilicon layers. The conductive layers 13 and the conductive layers 15 contain higher concentration of the impurities than the channel bodies 14.

Laminate bodies of the conductive layers 13, the channel bodies 14, and the conductive layers 15 are formed in pillar shapes, and are arranged on the plurality of global bit lines GBL in a matrix shape.

Gate insulating films 16 are provided between the channel bodies 14 and the select gate lines SG.

The select gate lines SG that are adjacent in the X direction sandwich each channel body 14 via the gate insulating films 16.

Interlayer insulating films 12 as illustrated in FIG. 3 are provided on the select gate lines SG.

A stacked body to be described later is provided on each interlayer insulating film 12.

As illustrated in FIG. 3, insulating layers 20 are provided on interlayer insulating film 12. The insulating layers 20 are formed of, for example, silicon oxide films.

Plural layers of word lines WL are stacked on insulating layers (insulating layers of the lowest layer) 20. Word lines WL are arranged corresponding to a number of the select gate lines SG in the X direction in each layer. The word lines WL extend in the Y direction. The insulating layers 20 are provided between the word lines WL in different layers.

Bit lines BL formed of a pillar-shaped metal material are provided on the conductive layers 15. The bit lines BL are arranged in a matrix shape in the X direction and Y direction.

Figure 6A:
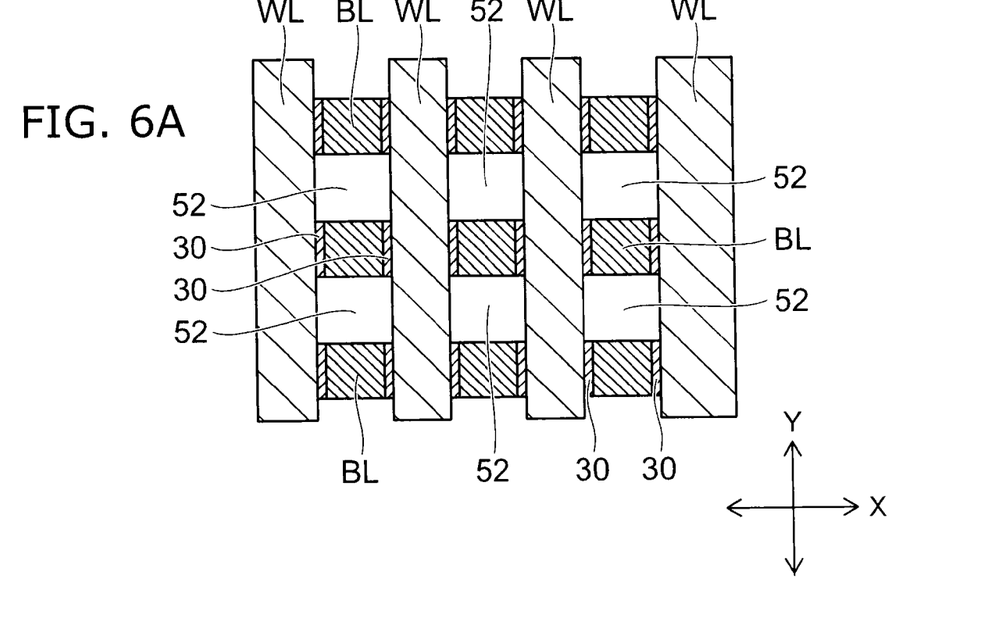
Figure 6B:
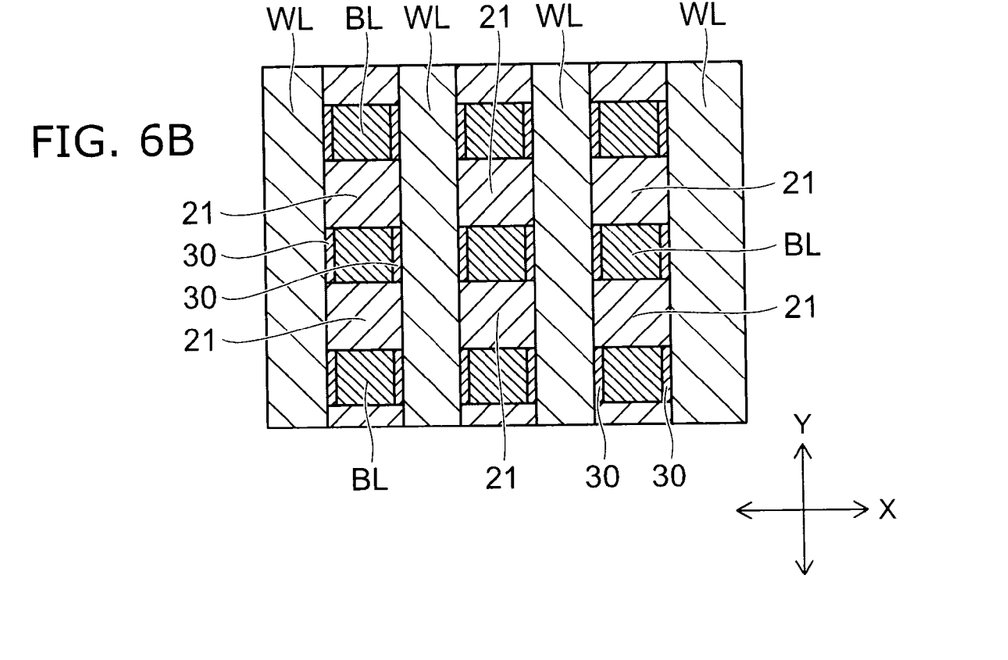

The bit lines BL are aligned in the Y direction between the word lines WL that are adjacent in the X direction. Inter-bit line insulating films 21 as illustrated in FIG. 6B are provided between the bit lines BL that are adjacent in the Y direction. The inter-bit line insulating films 21 are provided in pillar shapes extending in the Z direction (third direction), similar to the bit lines BL.

Selecting elements are arranged between the bit lines BL and the global bit lines GBL. Here, the selecting elements include the gate insulating films 16, the conductive layers 13, 15, the channel bodies 14, and the select gates SG.

Resistance-change films 30 are provided between the bit lines BL and the word lines WL. The resistance-change films 30 are provided on both side walls in the X direction of the bit lines BL. The word lines WL that are adjacent in the X direction sandwich the bit lines BL via the resistance-change films 30.

As illustrated in FIG. 2, every other ones in the X direction of the word lines WL are connected to a common line, and are given the same voltage.

When a selecting element is turned on by a potential given to a select gate line SG, a bit line BL electronically connects to a global bit line GBL. That is, the selecting element selects a bit line BL that is a selected target.

The selecting element including the select gate line SG, the gate insulating films 16, and the channel body 14 selects a bit line BL to be activated.

The resistance-change films 30 can be electrically switched between a state in which a resistance is relatively low (set state) and a state in which the resistance is high (reset state), and store data in a non-volatile manner.

The resistance-change films 30 in the high resistance state transition to the low resistance state when a voltage of a certain value or more is applied through the bit line BL and the word line WL. The resistance-change films 30 in the low resistance state transition to the high resistance state when a current of a certain value or more flows through the bit line BL and the word line WL.

The resistance-change films 30 primarily contain an oxide containing at least one chemical element selected from the group consisting of hafnium (Hf), zirconium (Zr), nickel (Ni), tantalum (Ta), tungsten (W), cobalt (Co), aluminum (Al), iron (Fe), manganese (Mn), chromium (Cr), and niobium (Nb).

For example, the resistance-change films 30 are films of materials such as $HfO_2$, $Al_2O_3$, $TiO_2$, NiO, $WO_3$, $Ta_2O_5$ and the like.

In forming a memory cell array as described above, a stacked body in which plural layers of the word lines WL and the insulating layers 20 are alternately stacked is formed. Note that, the material of the word lines WL (word line material layers) is for example silicon layers to which impurities are added and that have conductivity, metal layers, or silicide layers.

Thereafter, in order to separate the word lines WL in the X direction, if the stacked body is processed in a line and space pattern by etching, an aspect ratio of the laminate bodies left in the line shapes becomes high, and there are cases in which the laminate bodies easily fall down.

Thus, in the embodiment, as will be described below, the stacked body including the word lines WL and the insulating layers 20 are prevented from being patterned in the line and space pattern.

FIGS. 4A to 6B are schematic plan views illustrating a method of forming the memory cell array according to the first embodiment.

After having formed the global bit lines GBL and the selecting elements on the substrate that is not illustrated, the plural layers of insulating layers 20 and the word line material layers are alternately stacked on the interlayer insulating layers 12 (illustrated in FIG. 3) as a base layer.

Figure 4A:
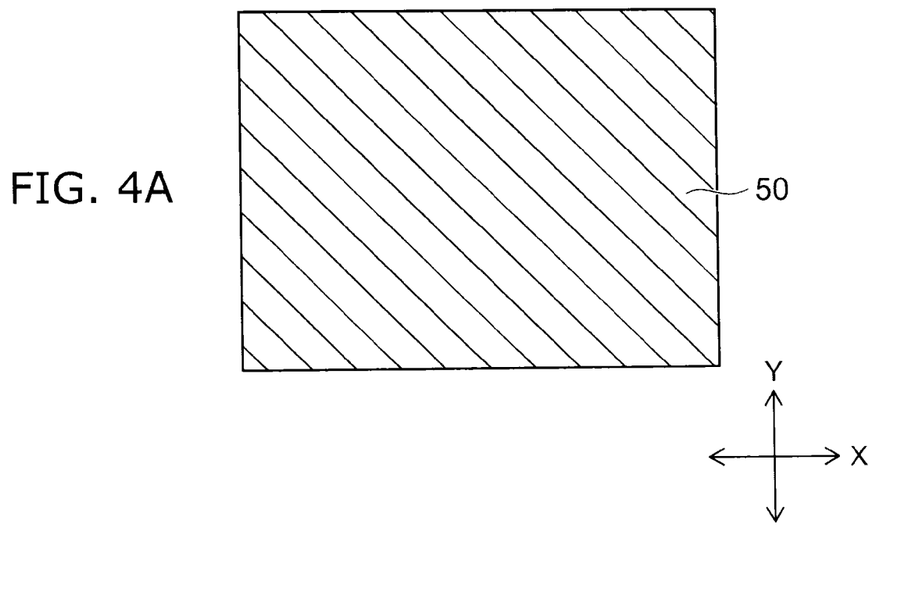

An uppermost layer of the stacked body is for example the insulating layer 20, and FIG. 4A illustrates a top surface 50 of the stacked body.

Figure 4B:
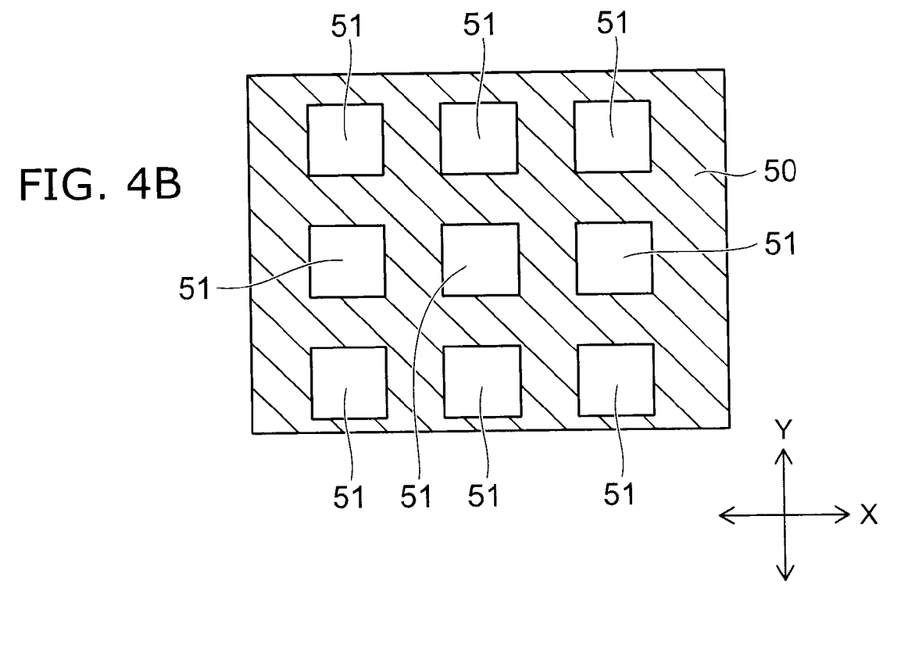

Next, as illustrated in FIG. 4B, a plurality of first holes 51 is formed on the stacked body. The first holes 51 are arranged in a matrix shape in the X direction and the Y direction.

The first holes 51 extend in the stacking direction of the stacked body, and lower ends of the first holes 51 reach the conductive layers 15 illustrated in FIG. 3.

Figure 5A:
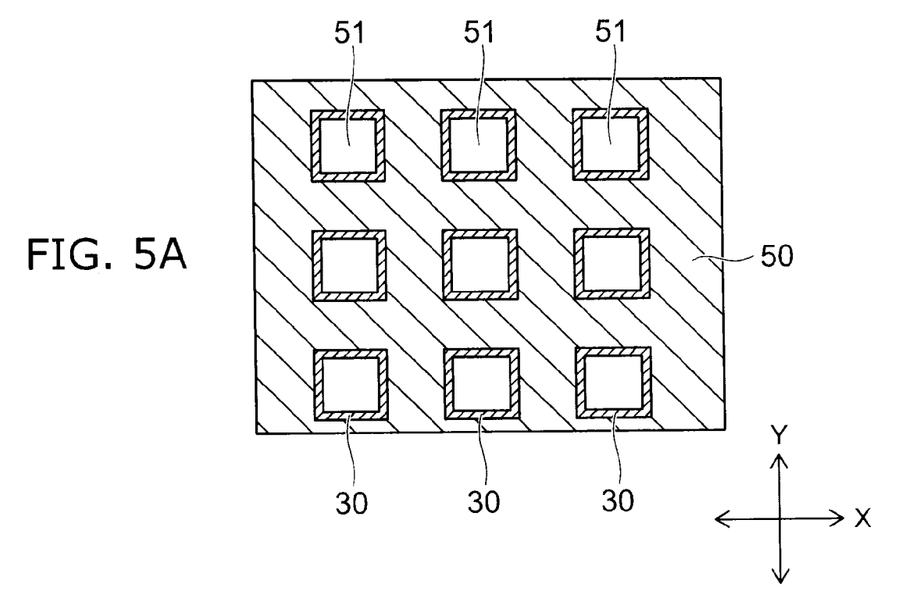

Next, as illustrated in FIG. 5A, the resistance-change films 30 are formed on inner walls of the first holes 51. The resistance-change films 30 are formed for example by an ALD (Atomic Layer Deposition) method, and are formed on side walls of the first holes 51 at a substantially homogenous and even film thickness. The film thickness of the resistance-change films 30 is for example a few nm. Thereafter, the resistance-change films 30 formed on bottom surfaces (top surfaces of the conductive layers 15) of the first holes 51 are removed by anisotropic etching such as an RIE method.

Figure 5B:
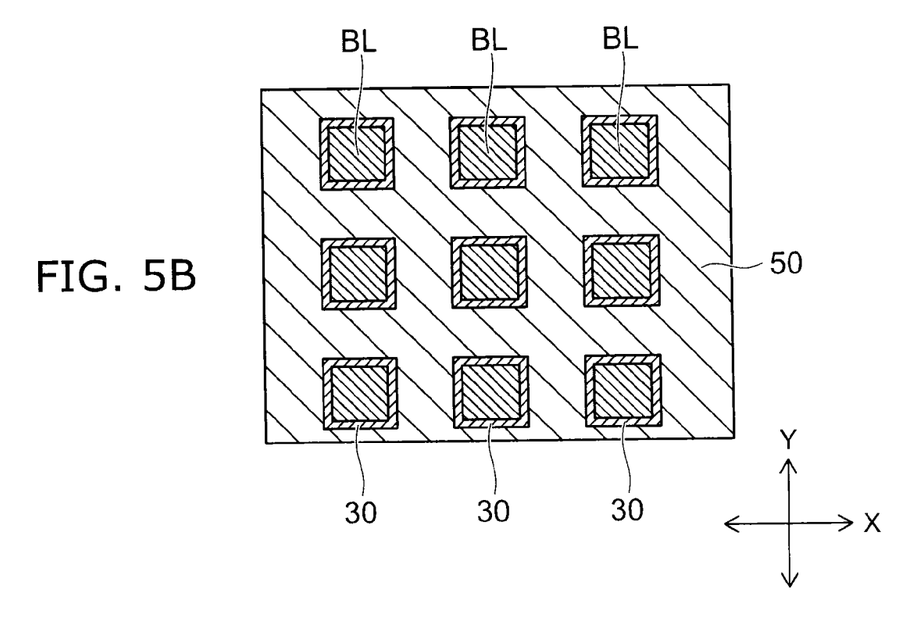

Next, a metal material or conductive silicon is embedded inside the resistance-change films 30 in the first holes 51, and as illustrated in FIG. 5B, the pillar-shaped bit lines BL are formed. Lower ends of the bit lines BL reach the conductive layers 15 illustrated in FIG. 3.

A periphery of each bit line BL is surrounded by the resistance-change film 30, and a periphery of each resistance-change film 30 is surrounded by the word lines WL and the insulating layers 20.

Next, in the stacked body, regions that are adjacent to the resistance-change films 30 in the Y direction are removed by etching. Due to this, as illustrated in FIG. 6A, second holes 52 are formed between the bit lines BL that are adjacent in the Y direction.

By the formation of the second holes 52, the stacked body is divided into a plurality in the X direction. That is, the word lines WL of the stacked body are processed into line-shaped word lines WL that are separated in the X direction and extend in the Y direction.

The second holes 52 extend in the stacking direction of the word lines WL, and lower ends of the second holes 52 reach the interlayer insulating films 12 illustrated in FIG. 3.

Further, by the etching that forms the second holes 52, the resistance-change films 30 that were provided on both side walls of the bit lines BL in the Y direction can also be removed.

Note that, the resistance-change films 30 that were provided on the both side walls of the bit lines BL in the Y direction may remain depending on etching conditions and materials.

After the second holes 52 have been formed, the pillar-shaped bit lines BL are aligned in the Y direction between the laminate bodies that are adjacent in the X direction, with the second holes 52 being interposed between the bit lines BL.

The laminate bodies are not processed in the line and space pattern, and the resistance-change films 30 and the pillar-shaped bit lines BL are provided in contact with the laminate bodies in between the laminate bodies that are adjacent in the X direction.

Accordingly, the laminate bodies that are divided in the X direction are supported by the resistance-change films 30 and the pillar-shaped bit lines BL being sandwiched between the laminate bodies that are adjacent in the X direction, and a possibility of fall-down is low.

As illustrated in FIG. 6B, the inter-bit line insulating films 21 are embedded in pillar shapes within the second holes 52.

Next, FIGS. 7A to 8B are schematic plan views illustrating a method of forming a memory cell array according to a second embodiment.

After having formed global bit lines GBL and selecting elements on a substrate that is not illustrated, layers of insulating layers 20 and word line material layers are alternately stacked on interlayer insulating layers 12 (illustrated in FIG. 3) as a base layer.

Figure 7A:
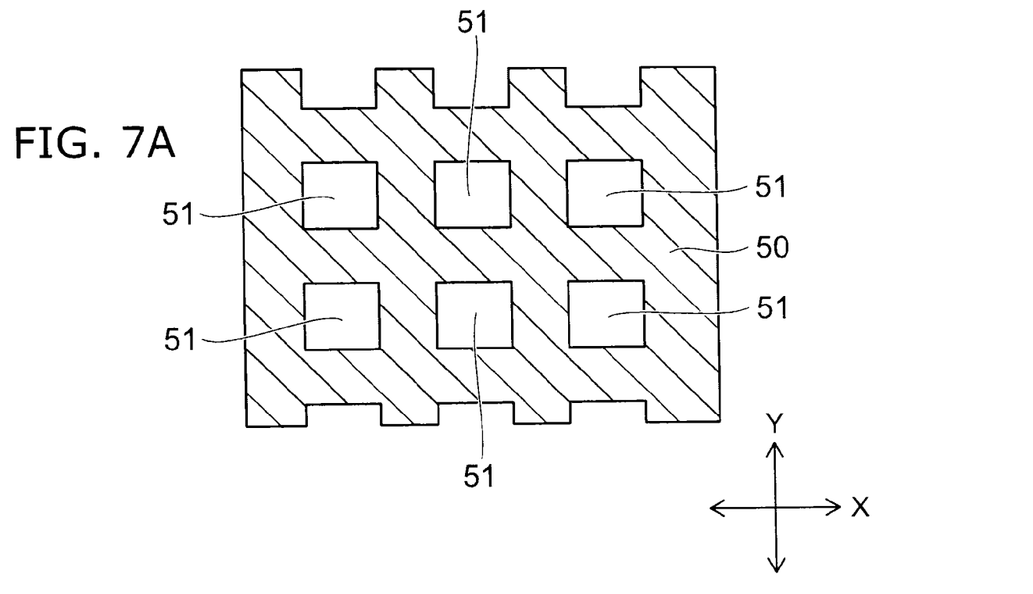

An uppermost layer of a stacked body is for example the insulating layer 20, and FIG. 7A illustrates a top surface 50 of the stacked body.

Next, as illustrated in FIG. 7A, first holes 51 are formed on the stacked body. The first holes 51 are arranged in a matrix shape in an X direction and a Y direction.

The first holes 51 extend in a stacking direction of the stacked body, and lower ends of the first holes 51 reach the interlayer insulating films 12 illustrated in FIG. 3.

Figure 7B:
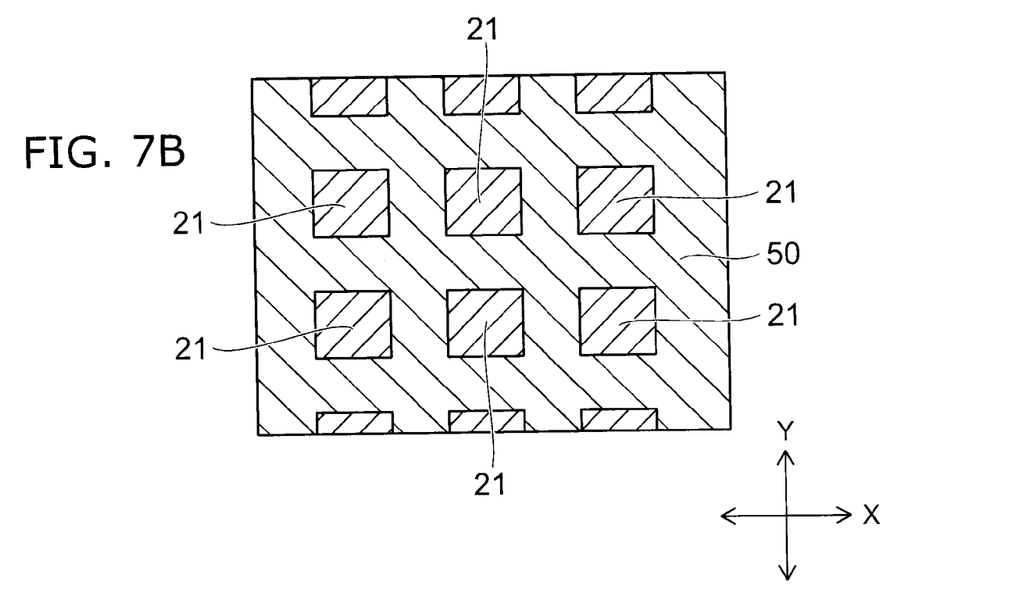

As illustrated in FIG. 7B, inter-bit line insulating films 21 are embedded in pillar shapes in the first holes 51.

Figure 8A:
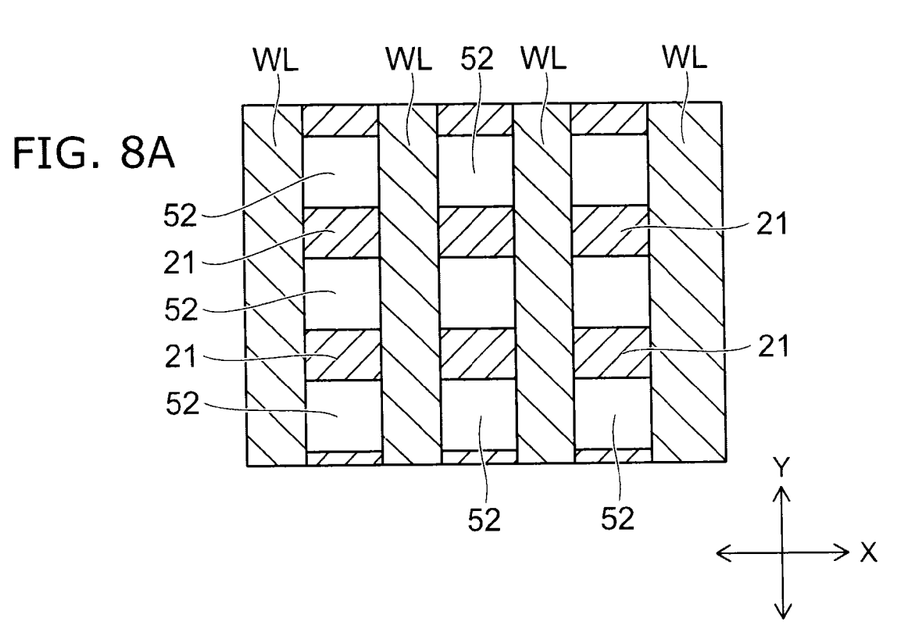

Next, in the stacked body, regions that are adjacent to the inter-bit line insulating films 21 in the Y direction are removed by etching. Due to this, as illustrated in FIG. 8A, second holes 52 are formed between the inter-bit line insulating films 21 that are adjacent in the Y direction.

By the formation of the second holes 52, the stacked body is divided into a plurality in the X direction. That is, the word lines WL are processed into line-shaped word lines WL that are separated in the X direction and extend in the Y direction.

The second holes 52 extend in the stacking direction of the word lines WL, and lower ends of the second holes 52 reach conductive layers 15 illustrated in FIG. 3.

After the second holes 52 have been formed, the pillar-shaped inter-bit line insulating films 21 are aligned in the Y direction between the laminate bodies that are adjacent in the X direction with the second holes 52 being interposed between the inter-bit line insulating films 21.

The laminate bodies are not processed in a line and space pattern, and the inter-bit line insulating films 21 are provided in contact with the laminate bodies between the laminate bodies that are adjacent in the X direction.

Accordingly, the laminate bodies that are divided in the X direction are supported by the pillar-shaped inter-bit line insulating films 21 being sandwiched between the laminate bodies that are adjacent in the X direction, and a possibility of fall-down is low.

Figure 8B:
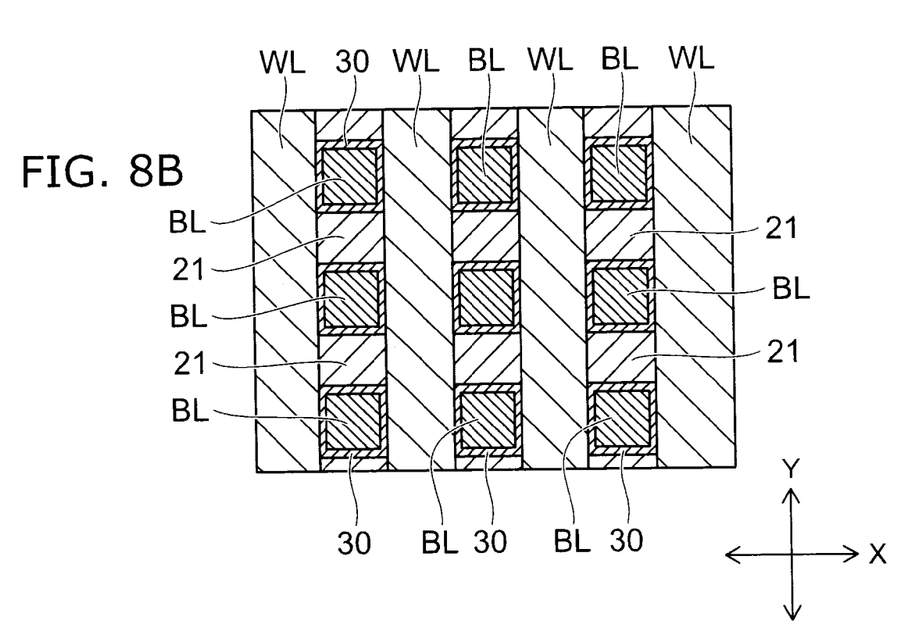

Next, as illustrated in FIG. 8B, resistance-change films 30 are formed on inner walls of the second holes 52. The resistance-change films 30 are formed for example by an ALD method, and are formed on side walls of the second holes 52 at a substantially homogenous and even film thickness. Thereafter, the resistance-change films 30 formed on bottom surfaces (top surfaces of the conductive layers 15) of the second holes 52 are removed by anisotropic etching such as an RIE method.

Next, a metal material or conductive silicon is embedded inside the resistance-change films 30 in the second holes 52, and pillar-shaped bit lines BL are formed. Lower ends of the bit lines BL reach the conductive layers 15 illustrated in FIG. 3. As a result, a periphery of each bit line BL is surrounded by the resistance-change film 30.

Next, FIG. 9A to FIG. 10B are schematic plan views illustrating a modification of a method of forming a memory cell array of the second embodiment.

Figure 9A:
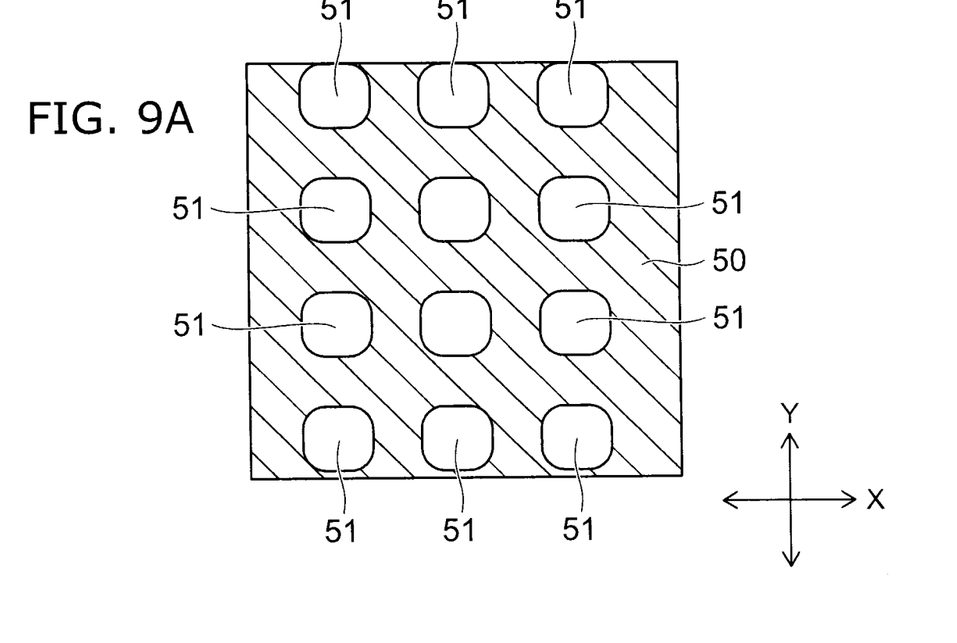

In this specific example, as illustrated in FIG. 9A, corners of first holes 51 are rounded. The corners of first holes 51 can be rounded by a control of etching conditions.

Figure 9B:
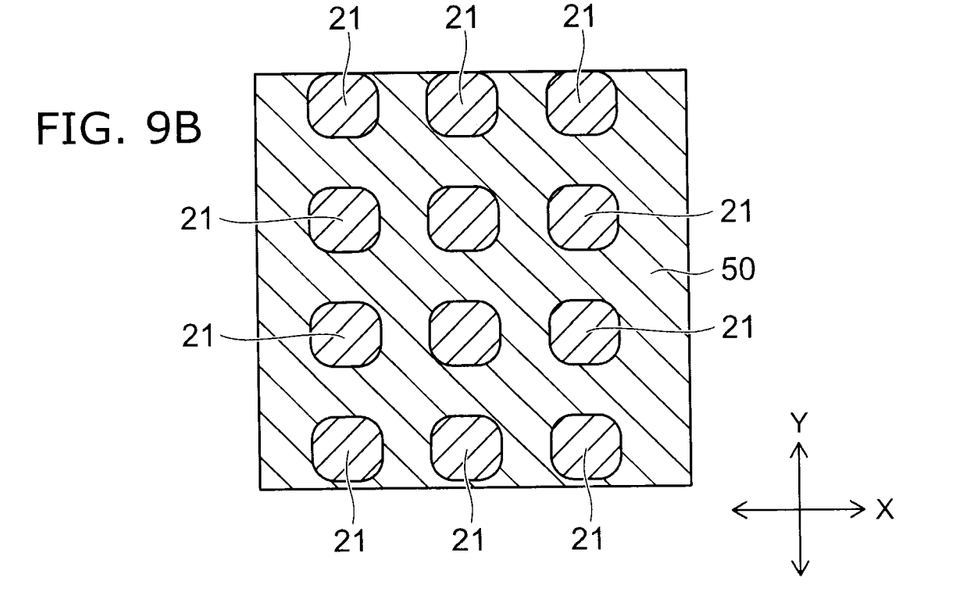

As illustrated in FIG. 9B, inter-bit line insulating films 21 are embedded in pillar shapes in the first holes 51. Corners of the inter-bit line insulating films 21 are also rounded in accordance with the hole shapes.

Figure 10A:
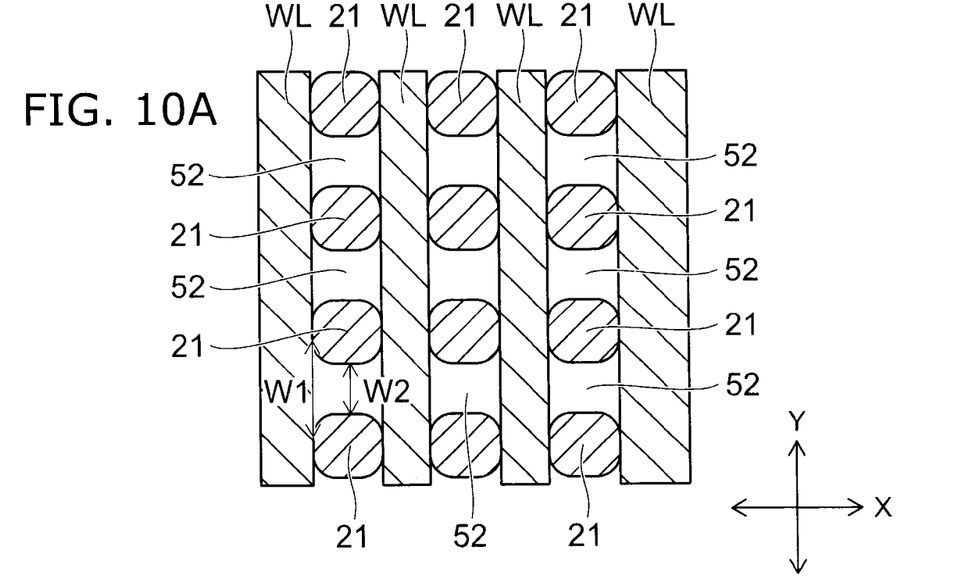

Next, in a stacked body, regions that are adjacent to the inter-bit line insulating films 21 in a Y direction are removed by etching. Due to this, as illustrated in FIG. 10A, second holes 52 are formed between the inter-bit line insulating films 21 that are adjacent in the Y direction.

The stacked body is divided into a plurality in the X direction. That is, word lines WL are processed into line-shaped word lines WL that are separated in the X direction and extend in the Y direction.

The inter-bit line insulating films 21 are provided in contact with the laminate bodies between the laminate bodies that are adjacent in the X direction. Accordingly, the laminate bodies that are divided in the X direction is supported by the pillar-shaped inter-bit line insulating films 21 being sandwiched between the laminate bodies that are adjacent in the X direction, and a possibility of fall-down is low.

Since the corners of the inter-bit line insulating films 21 are rounded, portions of the second holes 52 that become adjacent to the inter-bit line insulating films 21 are thereby curved. Due to this, a width of the second holes 52 in the Y direction becomes larger at their ends than at their center portion in the X direction.

A width W1 of surfaces of the word lines WL exposed by the second holes 52 in the Y direction is larger than a width W2 at the center portion of the second holes 52 in the X direction.

Figure 10B:
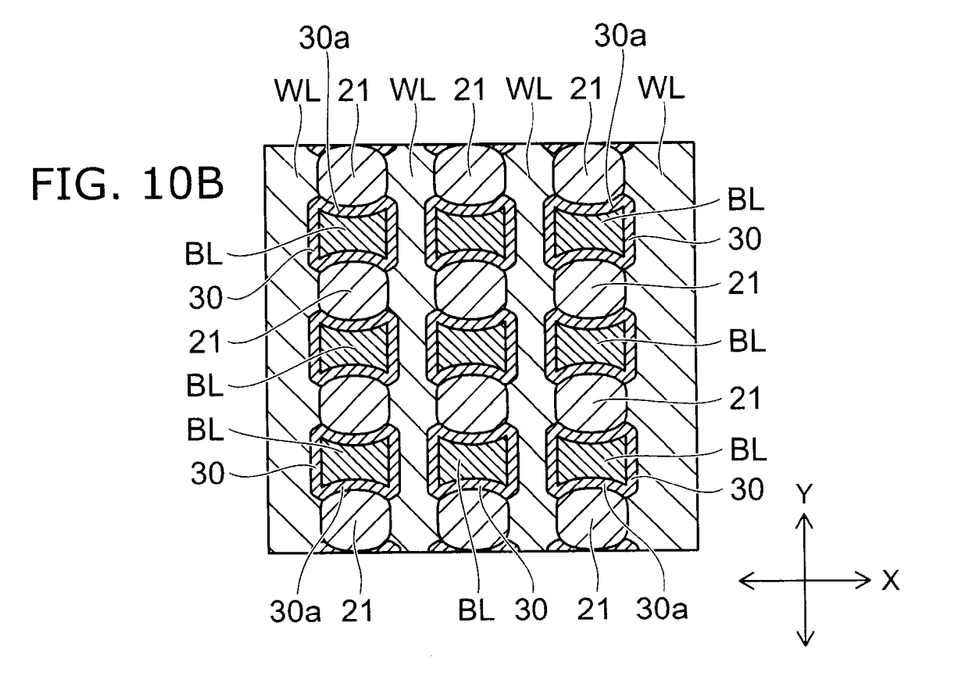

Next, as illustrated in FIG. 10B, resistance-change films 30 are formed on inner walls of the second holes 52. The resistance-change films 30 are formed for example by an ALD method on side walls of the second holes 52 at a substantially homogenous and even film thickness. Thereafter, the resistance-change films 30 formed on bottom surfaces (top surfaces of conductive layers 15) of the second holes 52 are removed by anisotropic etching such as an RIE method.

Next, a metal material is embedded inside the resistance-change films 30 in the second holes 52, and pillar-shaped bit lines BL are formed. Each resistance-change film 30 continuously surrounds an outer peripheral wall of each of the pillar-shaped bit lines BL.

An outer shape of the resistance-change films 30 and an outer shape of the bit lines BL reflect an outer shape of the second holes 52.

Accordingly, a width of the bit lines BL in the Y direction becomes large at their ends than at their center portion in the X direction. An area of the bit lines BL at portions facing the word lines WL via the resistance-change films 30 becomes large, and a forming voltage for forming a conduction path called a filament in the resistance-change films 30 can be reduced. It is possible to reduce the forming voltage, then it is possible to suppress defects from being generated in the resistance-change films 30.

Further, sidewall portions 30a of the resistance-change films 30 provided between the bit lines BL and the inter-bit line insulating films 21 are curved. Sidewall portions of the bit lines BL making contact with the curved sidewall portions 30a of the resistance-change films 30 are also curved.

In the resistance-change films 30, a length of the sidewall portions 30a can be made long by curving the sidewall portions 30a extending in the X direction and provided so as to connect the adjacent word lines WL. As a result, a leak current flowing via interfaces of the sidewall portions 30a between adjacent memory cells in the X direction can be suppressed.

In the first embodiment, the second holes 52 illustrated in FIG. 6A can be formed for example by the RIE (Reactive Ion Etching) method using a mask having a plurality of openings. That is, a mask having openings corresponding to relevant portions of the second holes 52. The stacked body under the openings of the mask is removed by etching.

Further, the second holes 52 can alternatively be formed by the RIE method using a mask having opening grooves extending in the Y direction. That is, a mask having opening grooves corresponding to relevant portions between laminate bodies that are adjacent in the X direction. Even by using such a mask having the opening grooves, the second holes 52 can be formed if an etching ratio of the bit lines BL and the resistance-change films 30 is differ from an etching ratio of the word lines WL and the insulating layers 20.

Figure 11A:
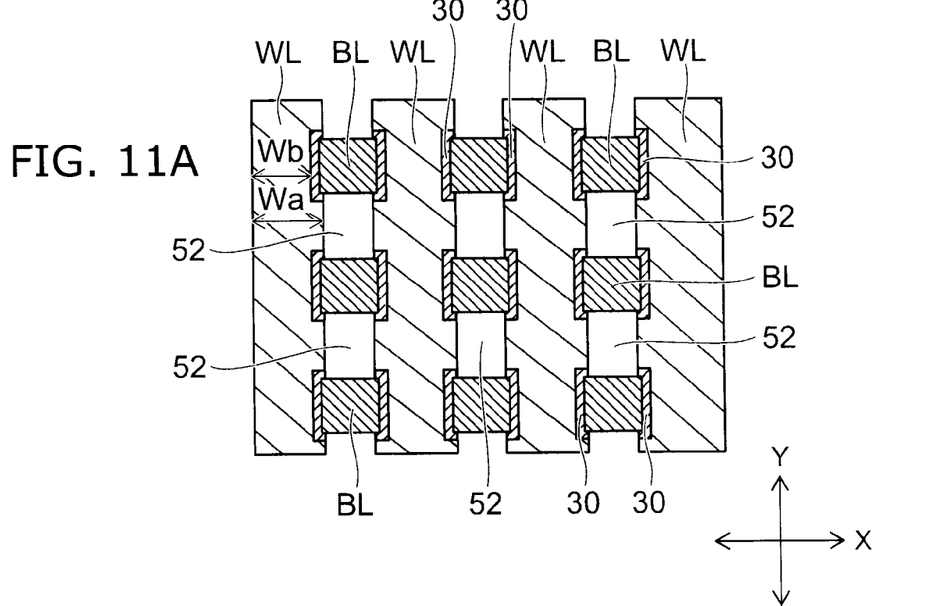

Here, for example, as illustrated in FIG. 11A, if positions of edges of mask opening grooves extending in the Y direction are positioned on a bit line BL side than ends of the resistance-change films 30 in the X direction, the width of the second holes 52 in the X direction becomes smaller than the widths of the bit lines BL and the resistance-change films 30 in the X direction of the stacked body.

That is, a width Wa of portions of the word lines WL adjacent to the second holes 52 becomes larger than a width Wb of the word lines WL adjacent to the bit lines BL.

Accordingly, sidewalls of the word lines WL along the Y direction are formed in a concavo-convex pattern. As a result, a resistance of the word lines WL can be made low. Note that, the ends of the word lines WL exposed by the second holes 52 are positioned on a center side of the bit lines BL than boundaries of the bit lines BL and the resistance-change films 30, so that the resistance-change films 30 between the bit lines BL and the word lines WL are not etched. In other words, the width Wb−width Wa is larger than the film thickness of the resistance-change films 30.

As for the second embodiment, similarly, the second holes 52 illustrated in FIG. 8A can be formed for example by the RIE method using the mask having the opening grooves extending in the Y direction.

The stacked body under the opening grooves of the mask is removed by etching.

Figure 11B:
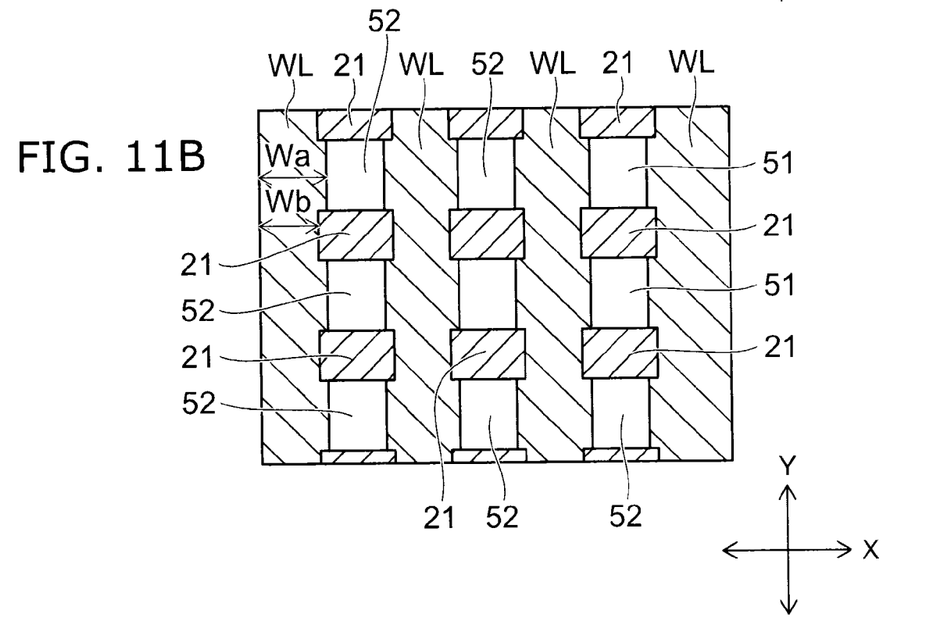

Here, for example, as illustrated in FIG. 11B, if positions of edges of the mask opening grooves extending in the Y direction are positioned to partially overlap with the inter-bit line insulating films 21, the width of the second holes 52 in the X direction becomes smaller than the width of the inter-bit line insulating films 21 in the X direction.

That is, a width Wa of portions of the word lines WL adjacent to the second holes 52 becomes larger than a width Wb of the word lines WL adjacent to the inter-bit line insulating films 21.

Accordingly, sidewalls of the word lines WL along the Y direction are formed in a concavo-convex pattern. As a result, a resistance of the word lines WL can be made low.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A manufacturing method of a semiconductor memory device, comprising:
   forming a stacked body in which word line material layers and insulating layers are alternately stacked on a base layer;
   forming first holes on the stacked body so as to be arranged in a first direction and in a second direction that intersects with the first direction;
   forming resistance-change films on inner walls of the first holes;
   forming bit lines inside the resistance-change films in the first holes;
   dividing the stacked body in the first direction by forming second holes on the stacked body adjacent to the resistance-change films in the second direction; and
   forming inter-bit line insulating films in the second holes.

2. The method according to claim 1, wherein
   the dividing the stacked body included dividing the stacked body into a first stacked portion and second stacked portion, and
   the bit lines and the resistance-change films are sandwiched between the first stacked portion and the second stacked portion, the first stacked portion and the second stacked portion are adjacent in the first direction.

3. The method according to claim 1, wherein
   the bit lines are aligned in the second direction, with the second holes being interposed, after the forming of the second holes.

4. The method according to claim 1, wherein
   a width of portions of the word line material layers that are adjacent to the second holes is wider than a width of portions of the word line material layers that are adjacent to the bit lines after the forming of the second holes.

5. The method according to claim 1, wherein
   the resistance-change films are formed by an ALD (Atomic Layer Deposition) method.

6. The method according to claim 1, wherein
   in the forming of the second holes, the resistance-change films formed on side surfaces of the bit lines in the second direction are also removed.

* * * * *